United States Patent

Luo

[11] Patent Number: 6,087,224
[45] Date of Patent: Jul. 11, 2000

[54] MANUFACTURE OF TRENCH-GATE SEMICONDUCTOR DEVICES

[75] Inventor: JiKui Luo, Cardiff, United Kingdom

[73] Assignee: U.S. Philips Corporation, New York, N.Y.

[21] Appl. No.: 09/292,406

[22] Filed: Apr. 15, 1999

[30] Foreign Application Priority Data

Apr. 17, 1998 [GB] United Kingdom .................. 9808234

[51] Int. Cl.⁷ ............................................... H04L 21/336
[52] U.S. Cl. ........................ 438/270; 438/268; 438/212; 438/589
[58] Field of Search ................................... 438/268, 270, 438/271, 272, 212, 589

[56] References Cited

U.S. PATENT DOCUMENTS

| | | | |
|---|---|---|---|
| 5,324,971 | 6/1994 | Notley ...................................... | 257/328 |
| 5,366,914 | 11/1994 | Takahashi et al. . | |
| 5,378,655 | 1/1995 | Hutchings et al. ...................... | 437/203 |
| 5,532,179 | 7/1996 | Chang et al. . | |
| 5,665,619 | 9/1997 | Kwan et al. .............................. | 438/270 |
| 5,864,159 | 1/1999 | Takahashi ................................ | 257/330 |
| 5,864,167 | 1/1999 | Cutter ...................................... | 257/489 |
| 5,972,741 | 10/1999 | Kubo et al. .............................. | 438/268 |

*Primary Examiner*—Trung Dang
*Attorney, Agent, or Firm*—Steven R. Biren

[57] ABSTRACT

The manufacture of a trench-gate semiconductor device, for example a MOSFET or IGBT, includes the steps of forming at a surface (10a) of a semiconductor body (10) a first mask (51) having a first window (51a), and later forming a second mask (52) having a smaller window (52a) by providing sidewall extensions (52b) on the first mask (51). A source region (13) is formed by dopant (63) introduced via the first window (51a), whereas a trench (20) is etched at the smaller window (52a) to extend through a body region (15) and into an underlying portion of a drain region (14). The gate (11) is provided in the trench (20) adjacent to where the channel (12) of the device is accommodated. After removing the second mask (52), a source electrode (23) is provided to contact the source region (13) and an adjacent region (15) of the body (10) at the surface (10a). This method permits the use of self-aligned masking techniques while providing good reproduceability in the doping of the source region (13) and adjacent region (15) and in the contact area of the source electrode (23) with both the source region (13) and the adjacent region (15).

10 Claims, 4 Drawing Sheets

6,087,224

MANUFACTURE OF TRENCH-GATE SEMICONDUCTOR DEVICES

BACKGROUND OF THE INVENTION

This invention relates to methods of manufacturing a trench-gate semiconductor device, for example an insulated-gate field-effect power transistor (commonly termed a "MOSFET") or an insulated-gate bipolar transistor (commonly termed an "IGBT"). The invention also relates to semiconductor devices manufactured by such a method.

Such trench-gate semiconductor devices are known having source and drain regions of a first conductivity type separated by a channel-accommodating body region of the opposite second conductivity type. An advantageous method of manufacture is disclosed in United States patent U.S. Pat. No. 5,378,655 (our reference PHB 33836), in which the formation of the source region is self-aligned with the trench (also termed "groove") which comprises the gate. The self-alignment is achieved by forming a second mask from a first mask, by the provision of sidewall extensions on the first mask. These sidewall extensions act as self-aligned spacers. The method of U.S. Pat. No. 5,378,655 includes the steps of:

(a) forming an etchant mask on the device body having a window at an area of a region of the second conductivity type in the body where the gate and channel are to be formed, (b) etching the trench into the device body at the window to extend through the region of the second conductivity type and into an underlying portion of the drain region, (c) providing a gate in the trench where the region of the second conductivity type provides the channel-accommodating region, and then providing a mask (the "first" mask) over the gate in the trench, this first mask forming a protruding step to the adjacent surface of the body, (optionally forming a layer of the first conductivity type at the window in the first mask), (d) forming the second mask with a smaller window by providing sidewall extensions of the first mask at the step, (e) forming the source region by etching away the first-conductivity-type layer at the area of the window in this second mask or by introducing dopant of the first conductivity type from these sidewall extensions into the region of the second conductivity type, and then (f) providing a source electrode at the surface of the body, so as to contact the source region and the adjacent surface region of the second conductivity type.

U.S. Pat. No. 5,665,619 describes a modified extension of this known method, in which the trench is defined and filled with silicon gate material using an etchant mask which is of complementary window pattern to the first mask and comprises silicon nitride. The silicon nitride masks underlying areas of the body against oxidation while oxidising an upper part of the gate material to form the first mask. Being of a differently-etchable material (silicon nitride) from the first mask (silicon dioxide), a subsequent etch-removal of the silicon nitride leaves the first mask (silicon dioxide) as the desired protruding step. However, some lateral oxidation of the silicon body surface does occur at the edge of the silicon nitride so resulting in a so-called "bird-beak" shape to the stepped edge of the first mask. It is difficult to control the lateral extent and step shape of this bird-beak. The whole contents of both U.S. Pat. No. 5,378,655 and U.S. Pat. No. 5,665,619 are hereby incorporated herein as reference material. By using such techniques as disclosed in U.S. Pat. No. 5,378,655 and U.S. Pat. No. 5,665,619, the number of photolithographic masking steps which require separate alignment can be reduced and compact cellular device structures can be formed.

Trench-gate semiconductor devices are also known in which the channel-accommodating body region is of the same, first conductivity type as the source and drain regions. In this case, the conductive channel is formed by charge-carrier accumulation by means of the trench-gate. Similar considerations arise with respect to the doping of the regions and the etching of the trench, as in the more usual device in which the channel-accommodating region is of the opposite, second conductivity type.

SUMMARY OF THE INVENTION

It is an aim of the present invention to modify the manufacture of trench-gate semiconductor devices so as to permit the use of self-aligned masking techniques while providing a flexible process with good reproduceability in the doping of the source region and adjacent region and in the contact area of the source electrode with both the source region and the adjacent region.

According to the present invention there is provided a method of manufacture wherein a source region is formed by introducing dopant of a first conductivity type into an area of a semiconductor body via a first window in a first mask at a surface of the body, sidewall extensions of the first mask are provided at the first window so as to form a second mask having a second window smaller than the first window, a trench is etched into the body at the second window to extend through the source region and into an underlying drain region of the first conductivity type, a gate is provided in the trench, and a source electrode is provided at the surface of the body.

The method as set out in claim 1 includes quite different steps (a) to (f) from the method steps of U.S. Pat. No. 5,378,655. In particular, the trench is etched at the smaller window in the second mask, either before or after providing the source region dopant at the window in the first mask. The remaining (contactable) area of the source region at the surface of the body is related to the lateral extent of the side-wall extensions of the first mask. There is considerable flexibility in the specific technology which can be used to form the first mask and its side-wall extensions, and so this technology can be chosen to give the side-wall extensions a well-defined lateral extent on the surface of the body. Furthermore the interface location between the source region and the adjacent region at the surface of the body is defined by the first window in the first mask.

Various preferred features in accordance with the invention are set out in claims 2 to 10.

It is particularly advantageous to use a complementary masking technique in forming the first mask so as to reduce the need for mask alignments, and to use the previous mask of complementary window pattern for an earlier process step. Thus, for example, dopant of an opposite second conductivity type may be introduced into an area of the body via the complementary window in the previous mask before forming the first mask at the complementary window. Such a doping step may be used to form, for example, a localised region of the second conductivity type which the source electrode contacts at the surface. This localised region which is formed via the window in the previous mask may be diffused deep into the body before forming the source region. In this way a deep opposite-conductivity-type region can be obtained to improve the blocking/breakdown characteristics of the device, without adversely affecting the doping profile of the (subsequently formed) source region.

BRIEF DESCRIPTION OF THE DRAWINGS

These and other features in accordance with the invention will now be illustrated in embodiments of the present invention, now to be described with reference to the accompanying diagrammatic drawings, in which.

Figure 1:
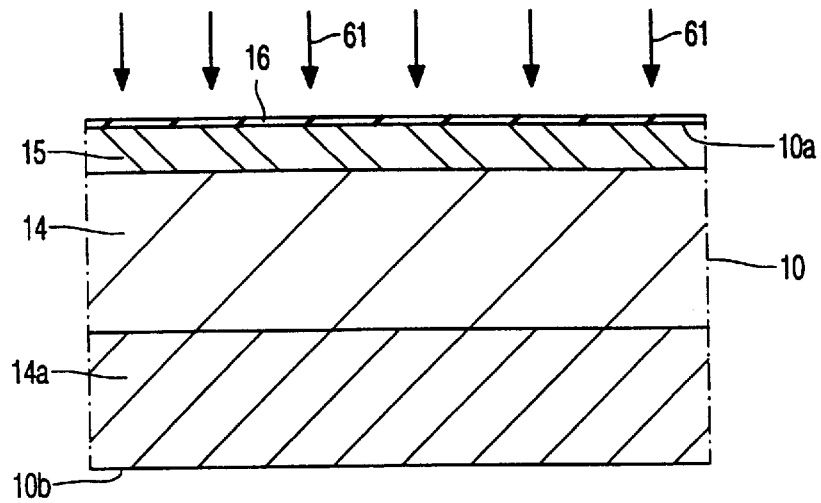
FIGS. 1 to 9 are a cross-sectional view of transistor cell areas of a semiconductor body at successive stages in the manufacture of a trench-gate semiconductor device by one example of a method in accordance with the present invention.

It should be noted that all the Figures are diagrammatic and not drawn to scale. Relative dimensions and proportions of parts of the drawings have been shown exaggerated or reduced in size, for the sake of clarity and convenience in the drawings. The same reference signs are generally used to refer to corresponding or similar features in different stages of manufacture and in modified and different embodiments.

DESCRIPTION OF THE PREFERRED EMBODIMENT

Figure 9:
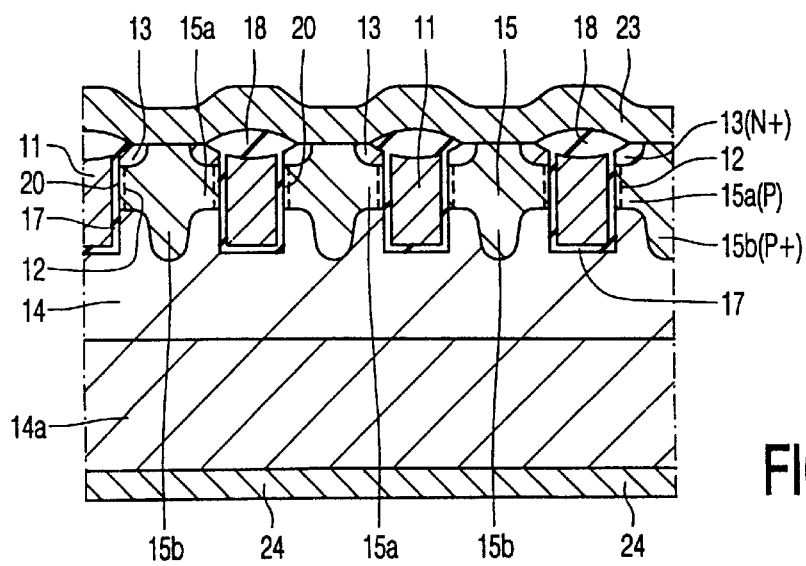

FIG. 9 illustrates an exemplary embodiment of a power semiconductor device having a trench-gate 11. In the transistor cell areas of this device, source and drain regions 13 and 14, respectively, of a first conductivity type (n-type in this example) are separated by a channel-accommodating region 15a of the opposite second conductivity type (i.e. p-type in this example). The gate I11 is present in a trench 20 which extends through the regions 13 and 15 into an underlying portion of the drain region 14. The application of a voltage signal to the gate 11 in the on-state of the device serves in known manner for inducing a conduction channel 12 in the region 15a and for controlling current flow in this conduction channel 12 between the source and drain regions 13 and 14. The source region 13 is contacted by a source electrode 23 at the top major surface 10a of the device body. By way of example, FIG. 9 shows a vertical device structure in which the region 14 may be a drain-drift region formed by an epitaxial layer of high resistivity on a substrate region 14a of high conductivity. This substrate region 14a may be of the same conductivity type (n-type in this example) as the region 14 to provide a vertical MOSFET, or it may be of opposite conductivity type (p-type in this example) to provide a vertical IGBT. The substrate region 14a is contacted at the bottom major surface 10b of the device body by an electrode 24, called the drain electrode in the case of a MOSFET and called the anode electrode in the case of an IGBT.

The device of FIG. 9 is manufactured by a method which, in overview of FIGS. 4 to 8, includes the steps of:

(a) forming at a surface 10a of a semiconductor body 10 (typically of silicon) a first mask 51 having a first window 51a at an area of the body, (b) forming the source region 13 by introducing dopant 63 of the first conductivity type (donor dopant in this example) into this area via the first window 51a, (c) forming on the body 10 a second mask 52 having a second window 52a which is smaller than the first window 51a by providing sidewall extensions 52b on the first mask 51 at the first window 51a, (d) etching a trench 20 into the body 10 at the second window 52a to extend through a body region 15 and into an underlying portion of the drain region 14, (e) providing a gate 11 in the trench 20 adjacent to where the the channel 12 is accommodated in a body region 15a of the second conductivity type (p-type in this example), and (f) providing a source electrode 23 at the surface 10a of the body 10 after removing the second mask 52 so as to expose the source region 13 and an adjacent region 15 at the surface 10a for contacting by the source electrode 23.

Furthermore, in this embodiment, a complementary masking technique is used to form the first mask 51, so further reducing the requirement for separate mask alignments. Thus, in overview of FIGS. 1 to 4, a previous mask 53 of complementary window pattern to the first mask 51 is formed at the surface 10a of the body 10 before the step (a), and dopant 62 of the second conductivity type (acceptor dopant in this example) is introduced into an area of the body 10 via the complementary window 53a in the mask 53 before the first mask 51 is formed at this complementary window 53a in the step (a). Indeed the embodiment of FIGS. 1 to 9 is so designed that all the subsequent masking steps in the cell areas shown in FIGS. 1 to 9 can be determined in a self-aligned manner from the mask 53. This self-alignment permits a reproduceable close spacing of the transistor cells, for example with a cell pitch of less than 5 µm, i.e. with a spacing of 5 µm (or less) between the centres of the neighbouring trenches 20.

No plan view of the cellular layout geometry is shown in the drawings, because the method of FIGS. 1 to 9 may be used for quite different, known cell geometries. Thus, for example the cells may have a square geometry as illustrated in FIG. 14 of U.S. Pat. No. 5,378,655, or they may have a close-packed hexagonal geometry or an elongate stripe geometry. In each case, the trench 20 (with its gate 11) extends around the boundary of each cell. FIG. 9 shows only a few cells, but typically the device comprises many hundreds of these parallel cells between the electrodes 23 and 24. The active cellular area of the device may be bounded around the periphery of the body 10 by various known peripheral termination schemes (also not shown). Such schemes normally include the formation of a thick field-oxide layer at the peripheral area of the body surface 10a, before the transistor cell fabrication steps. Furthermore, various known circuits (such as gate-control circuits) may be integrated with the device in an area of the body 10, between the active cellular area and the peripheral termination scheme. Typically their circuit elements may be fabricated with their own layout in this circuit area using some of the same masking and doping steps as are used for the transistor cells.

Successive stages in the fabrication of the transistor cells will now be described with reference to FIGS. 1 to 9.

FIG. 1 illustrates the stage in which a p-type region 15 is formed in the low-doped n-type region 14 by implantation of acceptor dopant ions 61, for example of boron. The implantation is carried out in the active cellular area defined by a window in the thick field-oxide layer (not shown). A thin layer 16 of silicon dioxide may be grown on the silicon body surface 10a, before implanting the ions 61. A heating step may be carried out to diffuse subsequently the implanted dopant to the desired depth for the region 15 in the body 10. This heating step may be delayed until after the ion implantation illustrated in FIG. 2.

Figure 2:
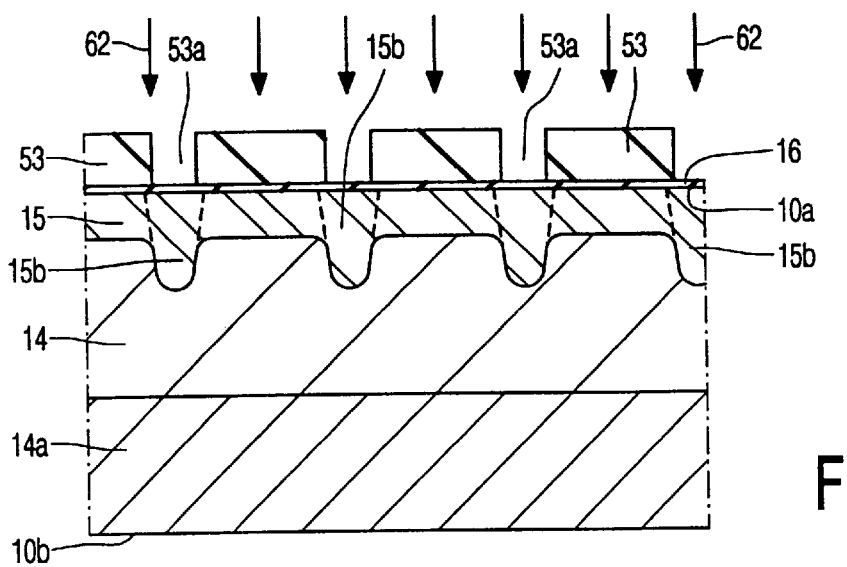

As illustrated in FIG. 2, the mask 53 is now provided at the body surface 10a. This mask 53 can be formed by depositing silicon dioxide material, and by subsequently opening the windows 53a using known photolithographic and etching techniques. In this way, a well defined window-edge can be formed for the mask 53. The thickness of the oxide mask 53 may be, for example, in the range of 1 $\mu$m to 1.5 $\mu$m. The mask 53 has an hexagonal grid pattern if an hexgonal geometry device is being manufactured. The windows 53a are narrow, for example 0.5 $\mu$m to 1 $\mu$m in width.

As illustrated in FIG. 2, a second ion implantation of, for example, boron ions 62 is now carried out. The oxide mask 53 is of sufficient thickness to mask the underlying silicon body 10 against this implantation, except at the windows 53a. The implanted dopant forms localised, highly-doped p-type regions 15b. These localised regions 15b can be formed from the surface 10a to a greater depth in the body 10 than the previously-implanted body region 15. Thus, a heating step may now be carried out to anneal and diffuse the implanted dopant 62 (and 61) to the desired depth.

Figure 3:
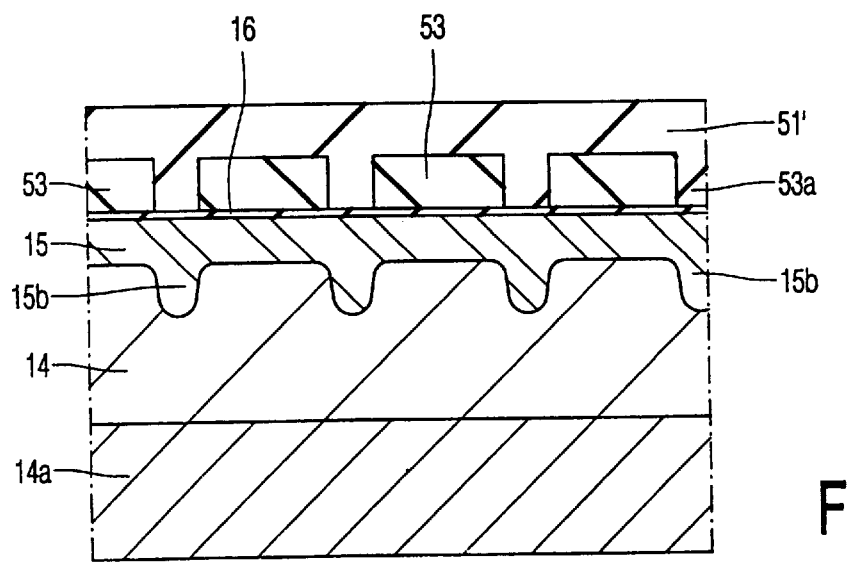

A thick layer 51' of silicon nitride is then deposited, for example using a known plasma enhanced chemical vapour deposition (PECVD) technique. As illustrated in FIG. 3, the silicon nitride is deposited in a thickness sufficient to fill the narrow windows 53a in the oxide mask 53 and to have a substantially flat upper surface. The silicon nitride layer 51 is then subjected to a known planarizing etch treatment, which etches back the layer 51' to re-expose the oxide mask 53 and to leave narrow silicon nitride pillars in the windows 53a. These silicon nitride pillars form the next mask 51 of FIG. 4.

Figure 4:
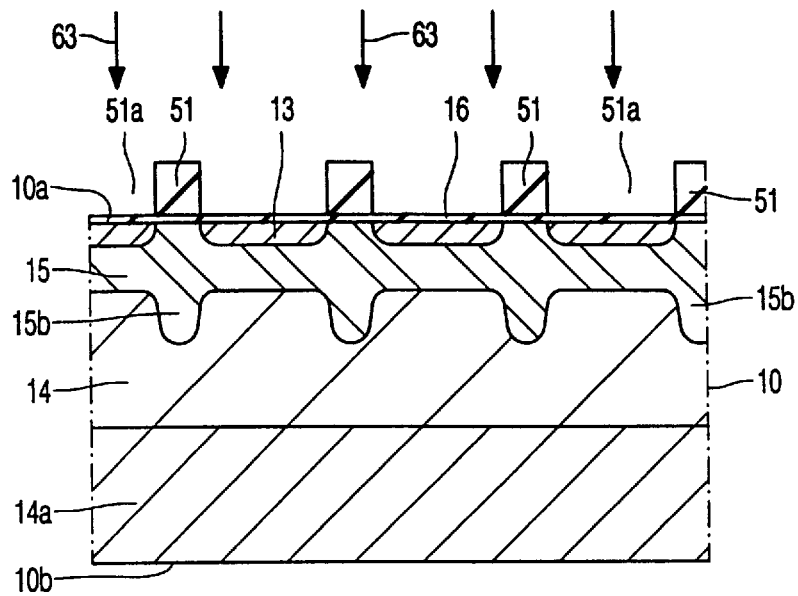
Figure 5:
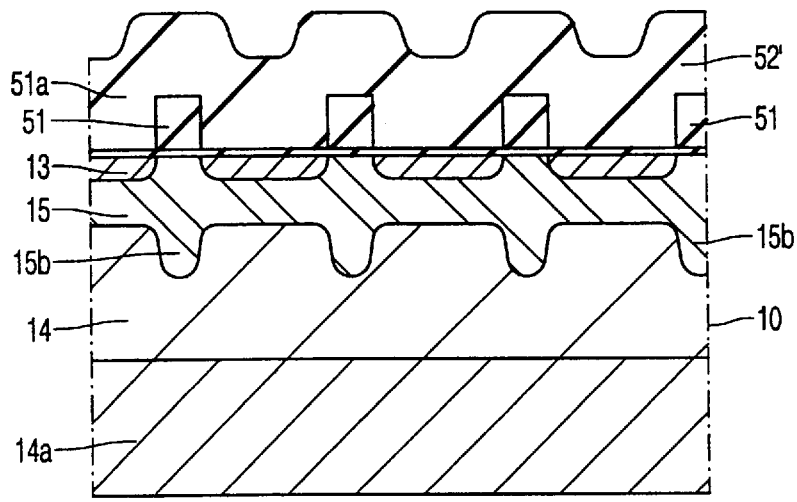

The structure of FIG. 4 is obtained by etching away the oxide mask 53, using a known selective etching treatment for silicon dioxide. The narrow silicon nitride pillars then remain at the body surface 10a as the mask 51. The mask 51 has, for example, an hexagonal dot pattern in the case of hexagonal geometry cells. An implantation of donor ions 63 (for example of phosphorous or arsenic) is now carried out to form the n-type regions 13 at the windows 51a. The silicon nitride mask 51 is of sufficient thickness to mask the underlying surface areas against this implantation of the donor ions 63. A heating treatment for annealing this donor implant may be carried out either now or later. As can be seen from FIG. 4, the n-type regions 13 are self-aligned in complementary manner with the deep p-type regions 15b.

A second silicon nitride layer 52' is now deposited over the layer structure at the surface 10a. The thickness of the layer 52' may be, for example, about 1 $\mu$m or more. Because the windows 51a are much wider than the narrow pillars forming the mask 51, the upper surface of the layer 52' is not flat but has a contour determined by the upstanding pillars forming the mask 51 at the surface 10a. The silicon nitride layer 52' is now uniformly etched back until central areas of the original windows 51a are once again opened. Due to the contoured upper surface of the layer 52', this general etch-back leaves side wall extensions 52b on the first silicon nitride mask 51. Thus, the resulting second silicon nitride mask 52 comprises the first mask 51 together with self-aligned spacers formed by these side wall extensions 52b. The resulting smaller window 52a of the mask 52 is therefore self-aligned with the wide windows 51a of the mask 51. This composite structure of the mask 52 is illustrated in FIG. 6.

Figure 6:
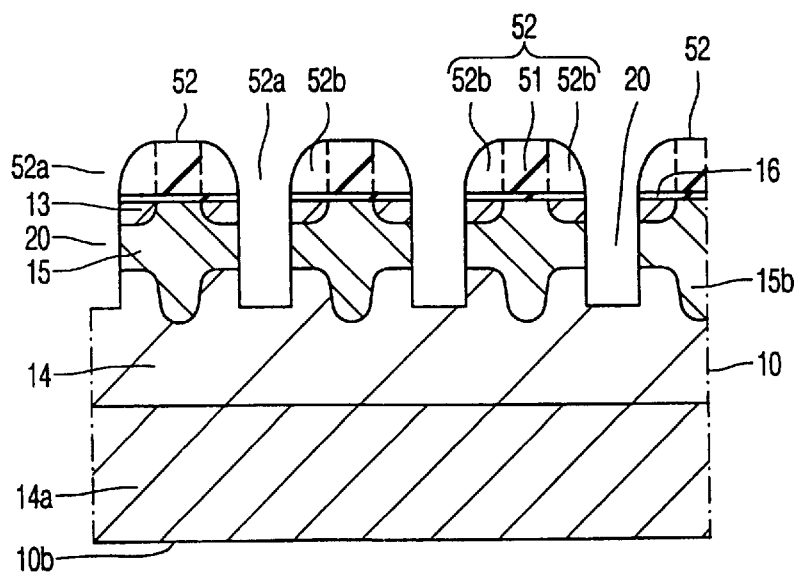

Also as illustrated in FIG. 6, an etching treatment is now carried out at the smaller windows 52a of the mask 52. When a thin oxide layer 16 is present, this oxide layer 16 is first etched away at the windows 52a. A silicon-etching treatment is then carried out in known manner, using the silicon nitride mask 52 as an etchant mask, to etch the trench 20 into the silicon body 10 at the windows 52a. The resulting structure is illustrated in FIG. 6. The layout pattern of the trench 20 is an hexagonal grid when an hexgonal geometry device is being manufactured.

Figure 7:
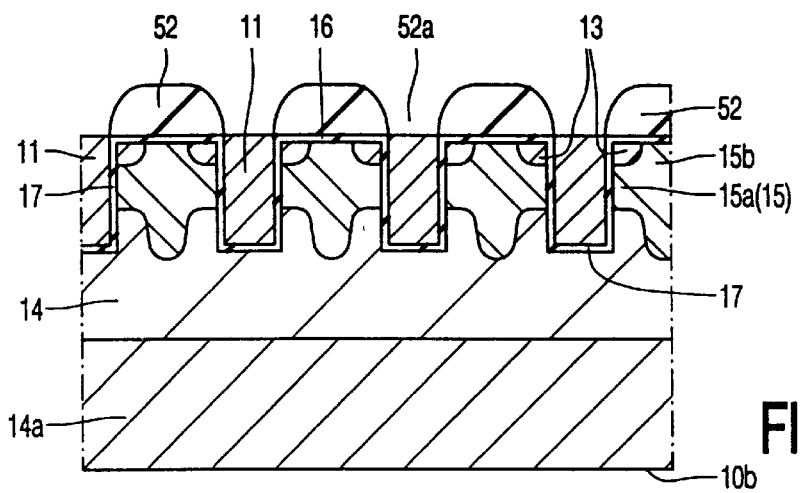

The silicon body 10 is now subjected to an oxidation treatment to form a thin silicon dioxide layer 17 on the exposed faces of the trench 20, while using the silicon nitride mask 52 to mask the silicon surface 10a against oxidation. The gate 11 may now be formed in known manner, by depositing doped polycrystalline silicon and then etching back the deposited polycrystalline silicon until it is left only in the trench 20. The resulting structure is illustrated in FIG. 7.

Figure 8:
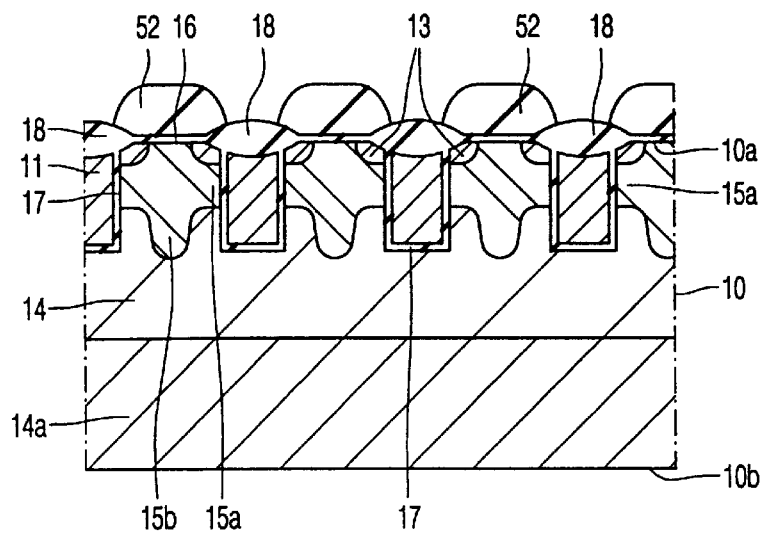

As illustrated in FIG. 8, a further oxidation treatment is now carried out to form an insulating overlayer 18 of silicon dioxide over the gate 11 in the trench 20. The silicon nitride mask 52 protects against oxidation the silicon body areas between the trenches 20. The insulating overlayer 18 is formed by oxidation of the upper part of the deposited silicon material in the trench 20. The resulting structure is illustrated in FIG. 8.

The silicon nitride mask 52 is now removed by etching, and the silicon surface 10a is exposed between the insulating overlayers 18 on the trench-gates 11. When a thin oxide layer 16 is present on the body surface 10a, an oxide etching treatment is carried out to remove the layer 16. This oxide etching treatment also thins slightly the insulating overlayers 18.

Electrode material (for example aluminium) is now deposited to provide the source electrode 23 in contact with the exposed silicon surface 10a of the regions 13 and 15. The lateral extent of the source electrode 23 is determined in known manner by photolithographic definition and etching of the deposited electrode material. As illustrated in FIG. 9, the source electrode 23 can also extend on the insulating overlayer 18 over the trench-gate 11. The higher doping of the region 15b as provided by the implanted dopant 62 forms a good contact region at the silicon body surface 10a. Furthermore, this contact region 15b extends to a greater depth in the body 10 than does the channel-accommodating region 15a, so improving the blocking characteristics of the pn junction between regions 14 and 15. In the device structure illustrated in FIG. 9, this region 15b extends slightly deeper in the body 10 than does the trench 20.

It will be evident that many variations and modifications are possible within the scope of the present invention. In FIG. 8 the insulating overlayer 18 is formed by oxidising the upper part of the deposited silicon material in the trench 20. However, an insulating overlayer 18 over the trench-gate 11 may be formed by deposition of an insulating material which is differentially etchable with respect to the material of the mask 52. In the process described for FIGS. 2 to 7, the mask 53 was of silicon dioxide, whereas the masks 51 and 52 were of silicon nitride. However, modified methods are possible in which the mask 53 is of silicon nitride, whereas one or more of the subsequently deposited layers 51' and/or 52' is of silicon dioxide. Furthermore, instead of using silicon nitride and silicon dioxide, other differently-etchable materials may be used for the masks 51, 52 and 53.

Figure 10:
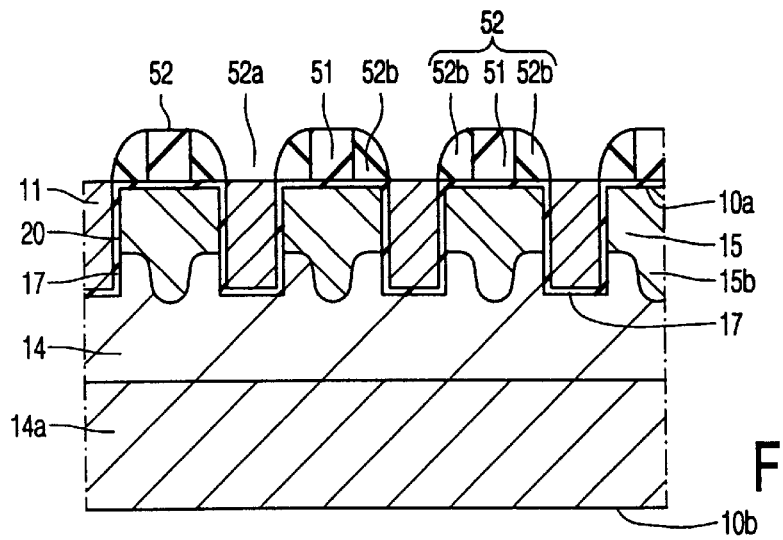
FIGS. 10 and 11 are a cross-sectional view of the transistor cell areas of FIGS. 7 to 9 at successive stages in a modified manufacturing method which is also in accordance with the invention.
Figure 11:
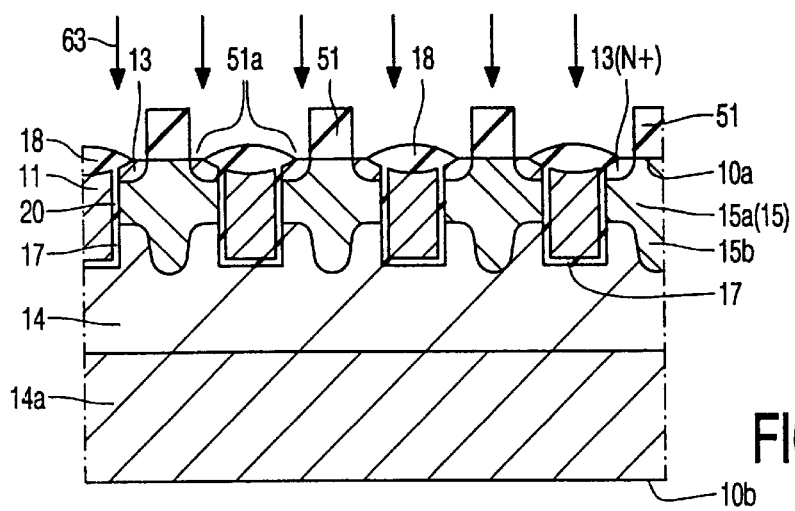

In the form illustrated in FIGS. 4 to 8, the mask 51 and the sidewall extensions 52b are of the same material, and both 51 and 52b are removed together after the FIG. 8 stage. In this process, the source region 13 is formed in FIG. 4, and the trench is etched in FIG. 6. This process sequence is particularly convenient. However, modifications are possible. Thus, FIGS. 10 and 11 illustrate a modification in which the mask 51 and the sidewall extensions 52 are of differently-etchable materials, and the source region 13 is formed later. In this case, no implantation with ions 63 is carried out at the FIG. 4 stage, and so the structure of FIG. 10 (without any source region 13) is obtained at the FIG. 7 stage. Thereafter the sidewall extensions 52 are etched away to leave the mask 51 at the surface 10a, and the FIG. 11 implantation of dopant ions 63 is then carried out to form the source region 13. FIG. 11 shows the insulating overlayer 18 present during this dopant ion implantation. This overlayer 18 may be formed by depositing a differently-etchable insulating material at the windows 52a, and then etching away the sidewall extensions 52. If it is desired to form the insulating overlayer 18 of FIG. 11 by oxidation of the gate material, then the sidewall extensions 52 may be of silicon nitride, and the mask 51 may comprise, for example, a multiple layer of silicon dioxide and silicon nitride.

Usually the conductive gate 11 is formed of doped polycrystalline silicon as described above. However, other known gate technologies may be used in particular devices. Thus, for example, other materials may be used for the gate, such as a thin metal layer which forms a silicide with the polycrystalline silicon material. Alternatively, the whole gate 11 may be of a metal instead of polycrystalline silicon. FIG. 9 illustrates the preferred situation of an insulated gate structure, in which the conductive gate 11 is capacitively coupled to the channel-accommodating region 15a by a dielectric layer 17. However, so-called Schottky gate technologies may alternatively be used in which a gate dielectric layer 17 is absent and the conductive gate 11 is of a metal that forms a Schottky barrier with the low-doped channel-accommodating region 15a. The Schottky gate 11 is capacitively coupled to the channel-accommodating region 15a by the depletion layer present at the Schottky barrier.

FIG. 1 illustrates the provision of the doping profile for the channel-accommodating region 15a (by implantation of dopant ions 61) before forming the deep localised region 15b. However, the doping profile for the channel-accommodating region 15a may be provided later, for example by implantation of dopant ions 61 at the window 51a in the mask 51 of FIG. 4. This implantation of the dopant ions 61 at the window 51a in the mask 51 may be carried out before implanting the source dopant ions 63 of FIG. 4.

The use of separate doses of ions 61 and 62 is advantageous to optimise the doping profiles for the channel-accommodating region 15a and the deep localised region 15b. However, modified processes may be acceptable for some devices in which, for example, a doped epitaxial layer is deposited to form the body region 15 in FIG. 1. In a less advantageous form, the doping profile for the channel-accommodating region 15a may even be formed by implantation of the ions 62 through a thinner mask 53, while the deeper region 15b is formed simultaneously by the ions 62 implanted at the windows 53a.

The device of FIG. 9 has localised, highly-doped (P+) p-type regions 15b which extend to a greater depth than the p-type channel-accommodating region 15a. This P+ deep localised region 15b in each cell improves the blocking/breakdown characteristics of the device. However devices may be manufactured in accordance with the invention, without requiring the FIGS. 2 and 3 stages for providing a deep P+ region 15b. This can result in smaller cells, as well as a simplified process. Thus, for example, the device may have only a shallow P+ region 15b which can be provided between the FIGS. 8 and 9 stages; a known example of the use of only a shallow P+ region in a known trench-gate MOSFET is given by U.S. Pat. No. 5,665,619. The device manufactured in accordance with the invention may even have no P+ extra region 15b; U.S. Pat. No. 5,378,655 provides a known example of the absence of an extra P+ region in a known trench-gate MOSFET.

The particular example described above is an n-channel device, in which he regions 13 and 14 are of n-type conductivity, the regions 15a and 15b are of p-type, and an electron inversion channel 12 is induced in the region 15a by the gate 11. By using opposite conductivity type dopants, a p-channel device can be manufactured by a method in accordance with the invention, in which the regions 13 and 14 are of p-type conductivity, the regions 15a and 15b are of n-type, and a hole inversion channel 12 is induced in the region 15a by the gate 11.

Figure 12:
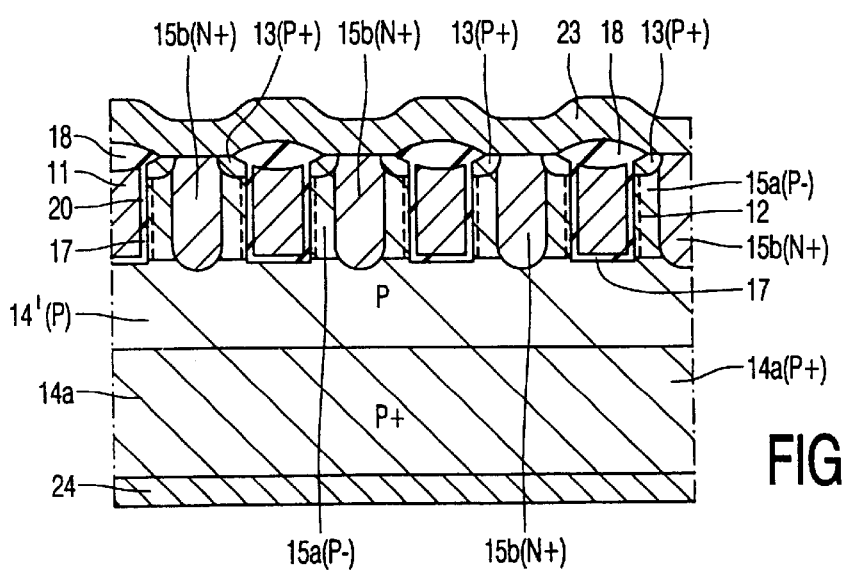
FIG. 12 is a cross-sectional view of the transistor cell areas of an accumulation-mode device which can also be manufactured by a modified manufacturing method in accordance with the invention.

Similar processing steps may be used to manufacture an accummulation-mode device in accordance with the invention. FIG. 12 illustrates a particular example of such a device of the p-channel type, having p-type source and drain regions 13 and 14a, a p-type channel-accommodating region 15a, and an n-type deep localised region 15b. In this particular example the channel-accommodating region 15a may be provided by a low-doped (P−) p-type epitaxial layer which forms the body region 15 of the same conductivity type as the source and drain regions 13 and 14a. This epitaxial layer 15 may be grown on a slightly higher doped (P) p-type epitaxial layer 14' on a highly doped (P+) p-type substrate region 14a. The n-type deep localised region 15b is formed by implantation and thermal diffusion similar to FIGS. 2 and 3, but extending through the depth of the p-type layer 15 and into the p-type layer 14'. The p-type source regions 13 and trench-gates 11 are formed by similar stages to FIGS. 4 to 8. N-type polycrystalline silicon may be used for the gate 11. In operation, a hole accummulation channel 12 is induced in the region 15a by the gate 11 in the on-state. The low-doped p-type regions 15a may be wholly depleted in the off-state, by depletion layers from the deep n-type region 15b and from the insulated gate 11. The retention of the layer 14' between the high doped substrate region 14a and the bottom of the region 15b provides a high avalanche break-down voltage for the p-n junction formed by the region 15b. A simplier device structure and process is also possible in which a single low-doped p-type epitaxial layer replaces the two layers 14' and 15.

From reading the present disclosure, other variations and modifications will be apparent to persons skilled in the art. Such variations and modifications may involve equivalent and other features which are already known in the design, manufacture and use of semiconductor devices and component parts thereof and which may be used instead of or in addition to features already described herein.

Although claims have been formulated in this Application to particular combinations of features, it should be understood that the scope of the disclosure of the present invention also includes any novel feature or any novel combination of features disclosed herein either explicitly or implicitly or any generalisation thereof, whether or not it relates to the same invention as presently claimed in any claim and whether or not it mitigates any or all of the same technical problems as does the present invention.

The Applicants hereby give notice that new claims may be formulated to any such features and/or combinations of such features during the prosecution of the present Application or of any further Application derived therefrom.

Thus, for example, as well as the invention set out in the following claims, there is also disclosed a method of manufacturing a method of manufacturing a field-effect semiconductor device having source and drain regions 13 and 14 of a first conductivity type separated by a channel-accommodating region 15a to which a gate 11 is capacitively coupled, and a localised region 15b of an opposite, second conductivity type which is adjacent to the source region 13, is contacted by the source electrode 23 and is more highly doped than the channel-accommodating region 15a, including the steps of:

(a) forming at a surface 10a of a semiconductor body 10 a mask 53 having a window 53a at a first area of the body, (b) forming a localised region 15b of an opposite, second conductivity type by introducing dopant 62 of the second conductivity type into the first area via the window 53a, the localised region 15b being thermally diffused to a greater depth in the body 10 than the depth of the channel-accommodating region 15a, (c) forming on the body 10 a mask 51 of complementary window pattern o the mask 53 by providing a differently-etchable material 51' from the mask 53 in the window 53a and then etch-removing the mask 53 from the body 10 while leaving the mask 51 at the first area where the localised region 15b is present, a second area of the body being present at the complementary window 51a in the mask 51, (d) forming the source region 13 by introducing dopant 63 of the first conductivity type into at least a part of the second area after thermally diffusing the localised region 15b as in step (b) and while masking the first area with the mask 51, (e) providing the gate 11 at another part of the second area adjacent to where a body region 15a accommodates the channel 12, and (f) providing a source electrode 23 on the body 10 after removing the mask 51, so as to contact the source region 13 of the first conductivity type and the localised region 15b of the second conductivity type at the surface 10a.

What is claimed is:

1. A method of manufacturing a trench-gate semiconductor device having source and drain regions of a first conductivity type which are separated by a channel-accommodating region adjacent to the trench-gate, including the steps of:

(a) forming at a surface of a semiconductor body a first mask having a first window at an area of the body, (b) forming the source region by introducing dopant of the first conductivity type into the said area via the first window, (c) forming on the body a second mask having a second window smaller than the first window by providing sidewall extensions on the first mask at the first window, (d) etching a trench into the body at the second window to extend through a body region and into an underlying portion of the drain region, (e) depositing material in the trench to provide the gate adjacent to where the channel is accommodated in the body, and (f) providing a source electrode on the body after removing the second mask so as to expose the source region and an adjacent surface region of the body for contacting by the source electrode.

2. A method as claimed in claim 1, wherein the step (b) is carried out before the step (c), and the trench is etched in step (d) through the source region and through a remaining underlying thickness of the body region and so into the underlying portion of the drain region.

3. A method as claimed in claim 1, wherein the first mask and the sidewall extensions are of differently-etchable materials, the sidewall extensions are etched away after the step (e) to leave at least a part of the first mask at the surface of the body, after which the step (b) is carried out to form the source region.

4. A method as claimed in claim 1, wherein the channel-accommodating region is a region is of an opposite, second conductivity type.

5. A method as claimed in claim 4, wherein dopant of the second conductivity type is introduced into the body before step (c) to provide the channel-accommodating region of the second conductivity type.

6. A method as claimed in claim 1, wherein dopant of the second conductivity type is introduced locally into the body before the step (a) at an area of the body at which the first mask is provided in the step (a), the local dopant introduction serving to provide the device with a localised region of the second conductivity type which is of higher conductivity than the channel-accommodating region adjacent to the trench, is separated by the channel-accommodating body region from the trench formed in step (d), and provides the said adjacent surface region which is contacted by the source electrode in step (f).

7. A method as claimed in claim 6, wherein the dopant forming the localised region is diffused to a greater depth in the body than the channel-accommodating region, before forming the source region in step (b).

8. A method as claimed in claim 1, wherein silicon material is deposited on an insulating layer in the trench to form the gate in step (e).

9. A method as claimed in claim 8, wherein the first mask comprises silicon nitride, silicon nitride is deposited and etched back to form the sidewall extensions of the first mask in step (c), and an upper part of the deposited silicon material in the trench is oxidised to provide an insulating overlayer over the gate while using the silicon nitride of the sidewall extensions and of the first mask to mask underlying areas of the body against oxidation.

10. A method as claimed in claim 1, wherein an insulating overlayer is formed over the gate before step (f), and the source electrode provided in step (f) extends on the surface of the body and also on the insulating overlayer.

* * * * *